(12) United States Patent
Yusa

(10) Patent No.: US 7,299,400 B2
(45) Date of Patent: Nov. 20, 2007

(54) ERROR CORRECTION CIRCUIT

(75) Inventor: Atsushi Yusa, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 503 days.

(21) Appl. No.: 11/057,150

(22) Filed: Feb. 15, 2005

(65) Prior Publication Data
US 2005/0204264 A1 Sep. 15, 2005

(30) Foreign Application Priority Data
Feb. 27, 2004 (JP) .............................. 2004-053317

(51) Int. Cl.
*G11C 29/00* (2006.01)
(52) U.S. Cl. .................................................. 714/764
(58) Field of Classification Search ................. 714/764
See application file for complete search history.

(56) References Cited
U.S. PATENT DOCUMENTS
4,794,597 A * 12/1988 Ooba et al. ................. 714/703
5,341,379 A * 8/1994 Crisp ......................... 714/709
5,978,953 A * 11/1999 Olarig ........................ 714/768
7,069,482 B1 * 6/2006 Callahan ..................... 714/710

FOREIGN PATENT DOCUMENTS
JP 2000-020409 1/2000

* cited by examiner

*Primary Examiner*—Shelly Chase
(74) *Attorney, Agent, or Firm*—Rabin & Berdo, P.C.

(57) ABSTRACT

An error correction circuit includes a selected-bit reverse circuit, an ECC circuit, a checkbit generation circuit, an ECC data register, a bit-comparing circuit, and an address memory unit. The selected-bit reverse circuit includes memory data and check data from the memory unit. The ECC circuit corrects a one-bit error. The checkbit generation circuit generates checkbits. The ECC data register stores the corrected data and the checkdata. The bit-comparing circuit compares each bit between the output data A from the selected-bit reverse circuit and the output data A' from the ECC data register. The address memory unit stores an address corresponding to the memory data when the bit-comparing circuit detects a discrepancy among the data A and the data A'. The error data memory unit writes the discrepancy information at the bit-location. The data OR circuit generates the first signal.

20 Claims, 5 Drawing Sheets

ERROR CORRECTION CIRCUIT

BACKGROUND OF THE INVENTION

1. Field of the Invention

The present invention generally relates to technology to improve data reliability of flash memory. More specifically, the present invention relates to technology to improve data reliability of flash memory mainly in ICs such as microcomputers having built-in flash memories.

2. Background Information

In conventional ICs such as microcomputers (referred to as MICOMs hereafter) that have built-in flash memories, error checking and correcting circuits (referred to as ECC circuits or EECs hereafter ) have been provided. The reason is that stored data are susceptible to change by disturbances from outside the memory when data-retention, data-write, or data-read is done. Especially, when a flash memory is used as a memory device for operation programs of MICOMs, a malfunction never fails to occur even if a CPU receives just one error bit, and then a checkbit for error checking is stored in addition to the data itself at every address in the flash memory. For example, a six-bit width checkbit is added to 32-bit width memory data.

After receiving the memory data and checkbits, the ECC circuit conducts one-bit error correction or more-than-two-bit error checking and sends the data to the CPU. An example of this final ECC circuit is shown in Japanese Patent Application Publication 2000-20409, which is hereby incorporated by reference.

However, a conventional ECC circuit, which adds a six-bit width checkbit to 32-bit width memory data, has a problem in that it can do one-bit error correction but not more-than-two-bit error correction. A problem arises because a malfunction occurs in a MICOM using a built-in flash memory as a memory device of the CPU programs when a more-than-two-bit error occurs.

In view of the above, it will be apparent to those skilled in the art from this disclosure that there exists a need for an improved error correction circuit. This invention addresses this need in the art as well as other needs, which will become apparent to those skilled in the art from this disclosure.

SUMMARY OF THE INVENTION

It is an object of the present invention to provide an error correction circuit that can deal with more-than-two-bit errors, solving the aforementioned problem.

To solve the aforementioned problem, the error correction circuit of this invention includes a selected-bit reverse circuit, an ECC circuit, a checkbit generating circuit, an ECC data register, a bit-comparing circuit, an address memory, and an error information memory. The selected-bit reverse circuit reverses an error bit in output data having a memory data and a check data from the memory device, based on a first signal. The ECC circuit corrects a one-bit error in the memory data, based on the output data from the selected-bit reverse circuit. The checkbit generating circuit generates checkbits, based on the correction data outputted from the ECC circuit. The ECC data register stores the correction data and the checkbit. The bit-comparing circuit compares each bit of the output data (first data group) A from the selected bit reverse circuit with each bit of output data (second data group) A' from the ECC data register. The address memory stores the address of the corresponding memory data when the bit comparing circuit detects a discrepancy between the data A and the data A'. The error information memory includes enough numbers of the error-bit memory circuit for the given bit-width of the data, and writes the bit-discrepancy-indicating information on the corresponding bit place. The data OR circuit conducts an OR logic operation on each group of data stored in a plurality of error data memory device and generates the first signal.

This invention enables the more-than-two-bit error correction that cannot be conducted by conventional ECC circuits using a six-bit width checkbit to 32-bit width data. Consequently, ICs such as MICOMs installing programs in its built-in flash memory have no possibility of malfunctioning even if a more-than-two-bit error occurs, and then the IC can realize an improvement in its reliability. Furthermore, since the number of the address memory devices that stores the address of error data and the number of the data memory can be respectively and flexibly changed, the most suitable circuit capacity can be selected according to the reliability of the flash memory.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

Figure 1:
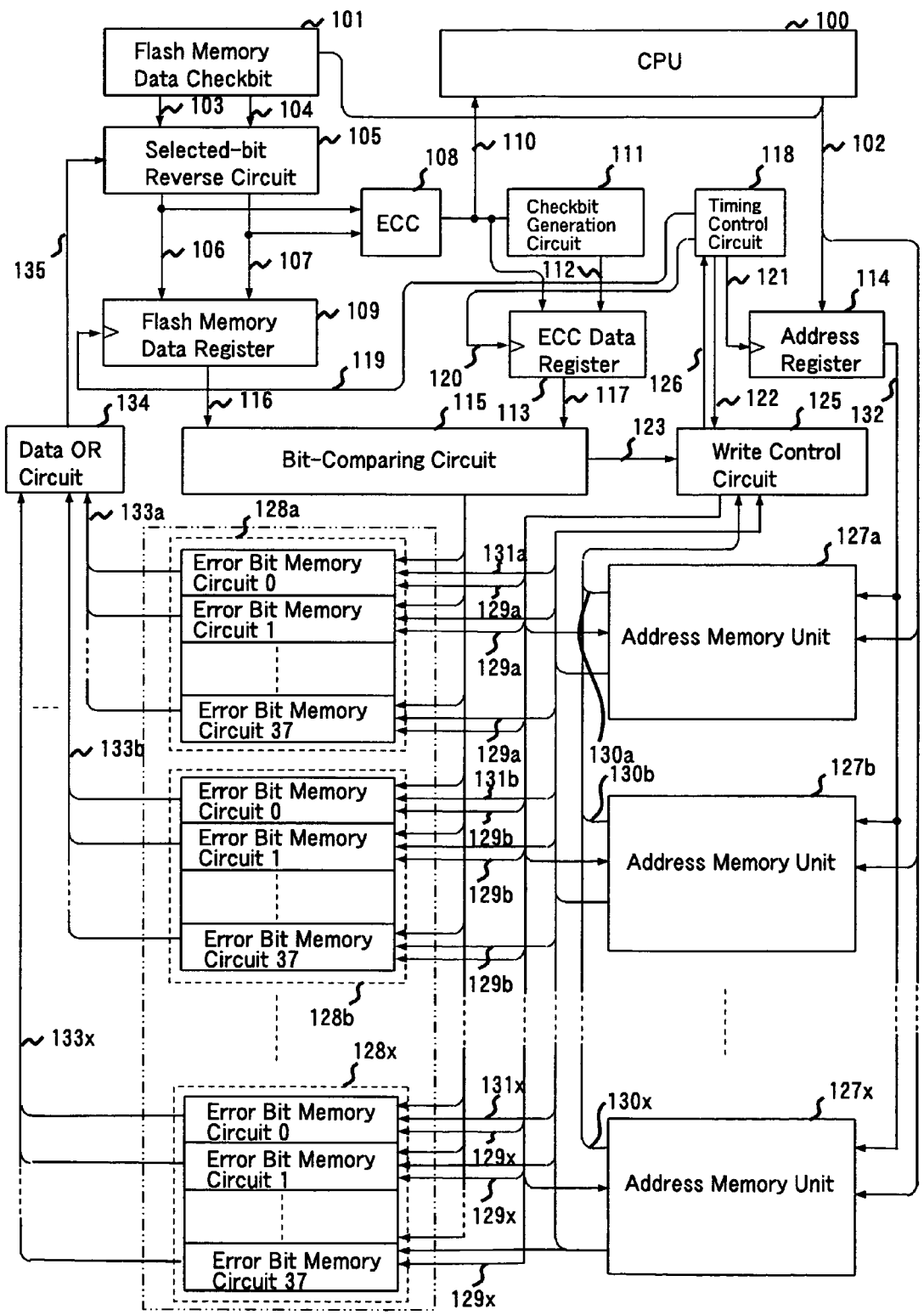
FIG. 1 is a view of a block diagram illustrating a basic configuration of an error checking and correction circuit ECC in accordance with a first embodiment of the present invention.

FIG. 1 is a block diagram illustrating the basic configuration of an ECC in accordance with a first preferred embodiment of the present invention. The ECC is composed of a CPU 100, a flash memory 101, a selected-bit reverse circuit 105, an ECC 108 for one-bit error correction circuit, a flash memory data register 109, a checkbit generation circuit 111, an ECC data register 113 for retention of the ECC data, an address register 114 to store output addresses from the CPU 100, a bit comparing circuit 115 to compare the output data from the ECC data register 113 with the output data from the flash memory data register 109, a timing control circuit 118 to control the data-setting timing in each component such as the flash memory data register 109, error data memories (error data memory unit) 128a-128x storing error bits, address memories (address memory unit) 127a-127x to store the address where an error occurs, a write control circuit 125 to control writing data in the aforementioned error data memories 128a-128x and address memories 127a-127x, and a data OR circuit 134 to conduct OR logic operations on each group of output data from the error data memories 128a-128x.

Figure 2:
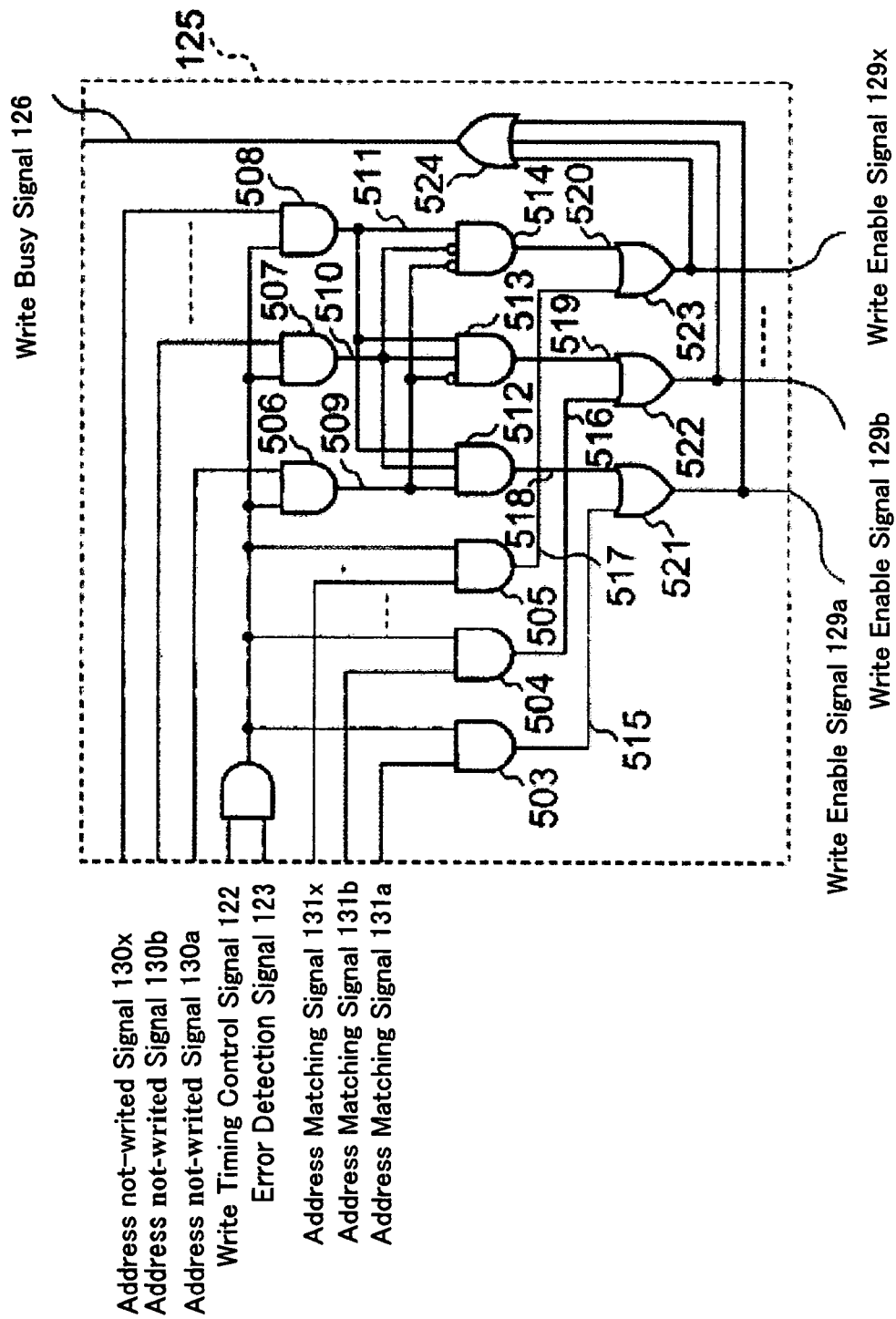
FIG. 2 is a view of a circuit diagram illustrating a write control circuit of the ECC circuit of FIG. 1.
Figure 3:
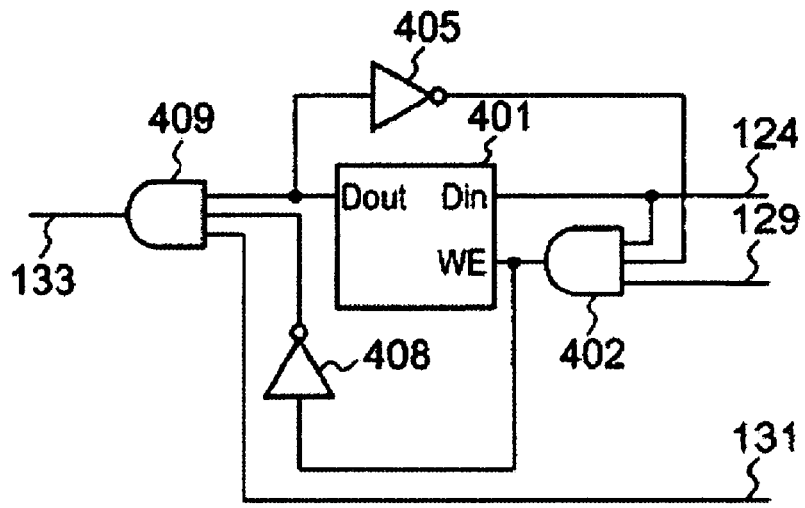
FIG. 3 is a view of a circuit diagram illustrating an error-bit memory circuit of the ECC circuit of FIG. 1.
Figure 4:
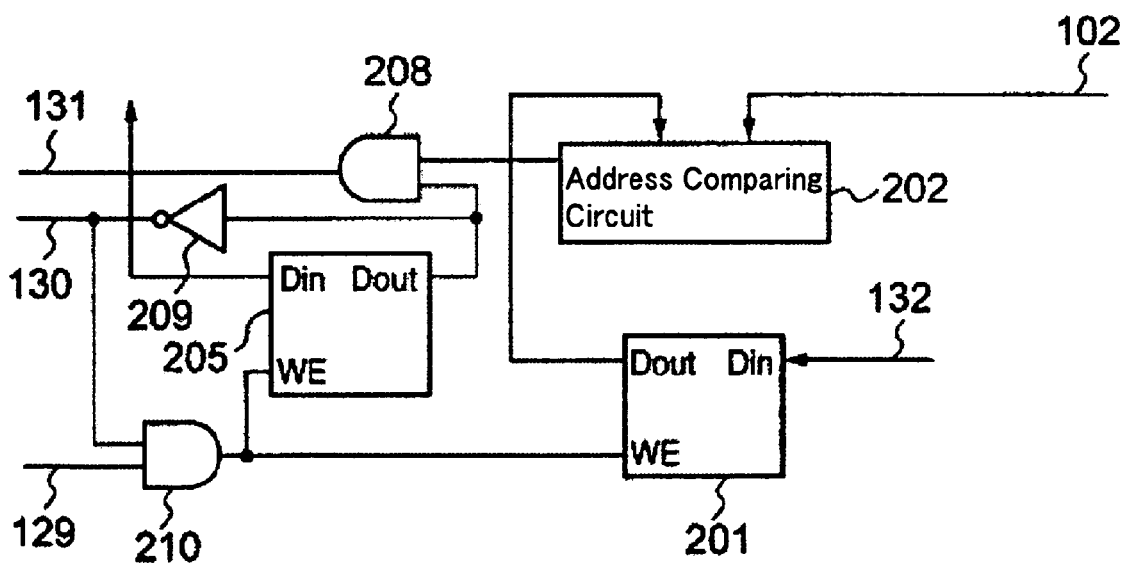
FIG. 4 is a view of a circuit diagram illustrating an address memory unit of the ECC circuit of FIG. 1.

FIG. 2 is a diagram of the write control circuit 125. FIG. 3 is a diagram of the error-bit memory circuit storing the one-bit error information in the error data memories 128a-128x. FIG. 4 is a diagram of the circuit inside the address memories 127a-127x.

The operation of this embodiment will now be explained as below, referring to the circuit diagrams of FIG. 1 to FIG. 4 and the timing chart of FIG. 5. During the read cycle (1), the CPU 100 outputs address data 102 at the timing t0. An address latch signal 121 from the timing control circuit 118 changes to 'H' level from 'L' level and the address data 102 are stored in the address register 114 at the rising edge of the level change. The output data change of the address register 114 is illustrated the first or top line of FIG. 5.

Figure 5:
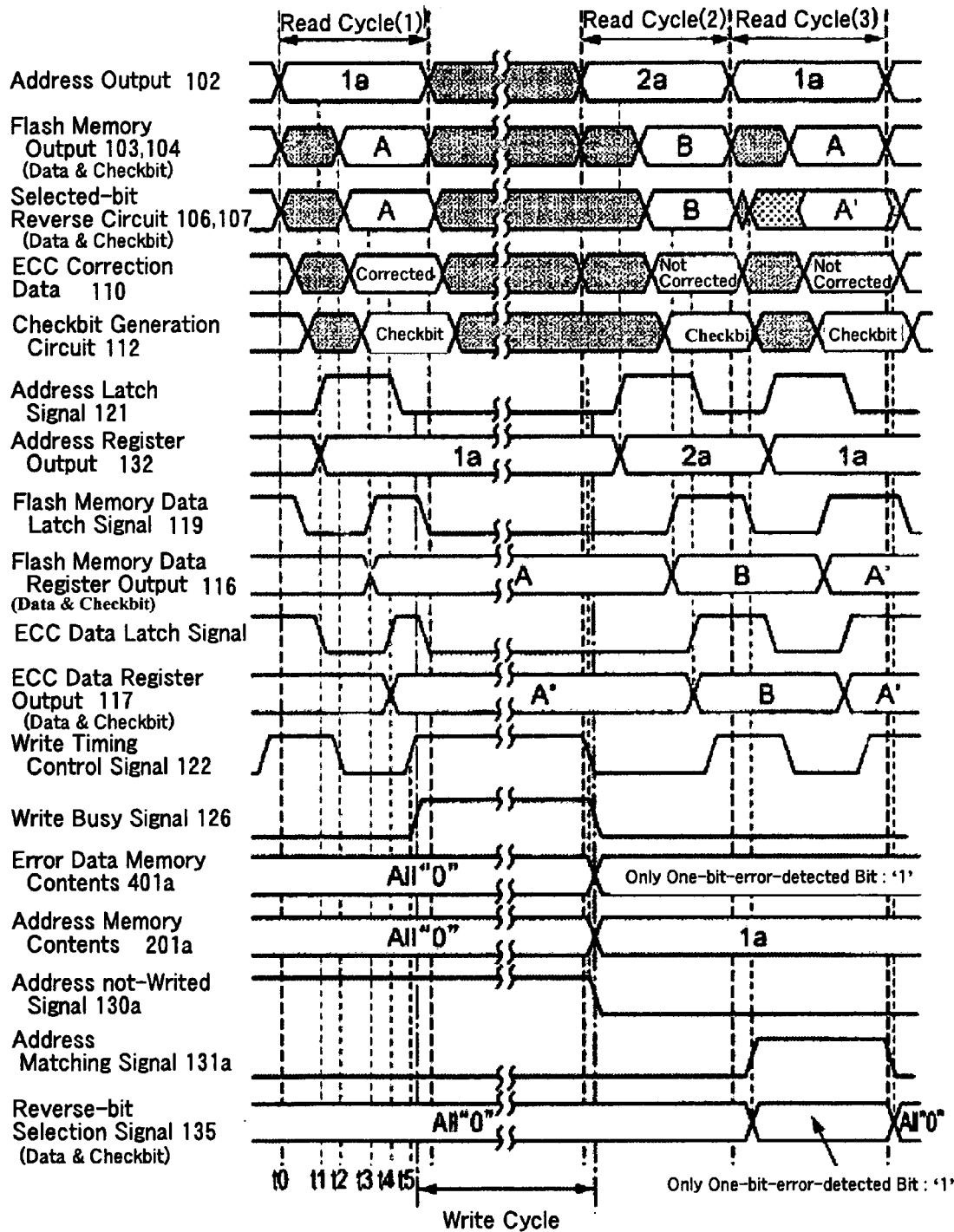
FIG. 5 is a view of a timing chart illustrating the basic timing of the ECC circuit of FIG. 1.

The flash memory 101 outputs memory data 103 and checkbit data 104 at the timing of t2 in FIG. 5 upon receiving the address data 102. The memory data are the contents of the memory itself and the checkbit data represent the checkbit. In this case, the memory data 103 and the checkbit data are supposed to be data A and the memory data 103 are supposed to have a one-bit error.

These output data are inputted to the selected-bit reverse circuit 105, which outputs output data 106 and 107 corresponding to data 103 and 104, based on the contents of a reverse-bit selection signal 135. At the initial stage in this case, the error data or its address data are not stored, and then any address matching signal 131 (131a, 131b, - - - , 133x) is 'L' level (address is mismatched: refer to FIG. 4) and any output signal 133 (133a, 133b, - - - , 133x) is 'L' level, too (refer to FIG. 3). Consequently, every bit of the reverse-bit selection signal 135 having the memory data and the checkbit changes to be level 'L'. As the result, the output data 106 and 107 of the selected-bit reverse circuit 105 are not reversed and then become the same data to output data A.

The ECC circuit 108 inputs the output data 106 and 107 of the selected-bit reverse circuit 105 and outputs correction data 110 after correcting one-bit error in the data. These correction data 110 are taken into the CPU 100 at the write cycle(1).

The data latch signal 119 changes to level 'H' from level 'L' at the timing t3 and at its rising edge the contents of the output data 106 and 107 are inputted into the flash memory 109, then the output data 116 becomes data A.

The checkbit generation circuit 111 outputs checkbit 112 made of the given numbers of a bit (for example six bits), after receiving the correction data 110 from the ECC circuit 108. For example, this checkbit is generated from the correction data 110, using a formula as below.

$$\begin{pmatrix} Y6 \\ Y5 \\ Y4 \\ Y3 \\ Y2 \\ Y1 \end{pmatrix} = \begin{pmatrix} 111111000000000000000000000000000 \\ 000000111111111111100000000000 \\ 000000111111100000001111110000 \\ 111000111100001111000111100001110 \\ 100110110011001100110011001101101 \\ 010101101010101010110101011011 \end{pmatrix} \begin{pmatrix} X32 \\ X31 \\ \ldots \\ \ldots \\ X2 \\ X1 \end{pmatrix}$$

$Y6 = X27(+)X28(+)X29(+)X30(+)X31(+)X32$ $Y5 = X12(+)X13(+)X14(+)X15(+)X16(+)X17(+)X18(+)X19(+)X20(+)X21(+)X22(+)X23(+)X24(+)X25(+)X26$ $Y4 = X5(+)X6(+)X7(+)X8(+)X9(+)X10(+)X11(+)X19(+)X20(+)X21(+)X22(+)X23(+)X24(+)X25(+)X26$ $Y3 = X2(+)X3(+)X4(+)X8(+)X9(+)X10(+)X11(+)X15(+)X16(+)X17(+)X18(+)X23(+)X24(+)X25(+)X26(+)X30(+)X31(+)X32$ $Y2 = X1(+)X3(+)X4(+)X6(+)X7(+)X10(+)X11(+)X13(+)X14(+)X17(+)X18(+)X21(+)X22(+)X25(+)X26(+)X28(+)X29(+)X32$ $Y1 = X1(+)X2(+)X4(+)X5(+)X7(+)X9(+)X11(+)X12(+)X14(+)X16(+)X18(+)X20(+)X22(+)X24(+)X26(+)X27(+)X29(+)X31$ (+) shows Exclusive or Sum symbol.

The ECC data latch signal 120 from the timing control circuit 118 changes to 'H' level from 'L' level at the t4 timing phase, and at its rising edge, the correction data 110 and the contents A' of the checkbit output data 112 are taken into the ECC data register 113, then the output data 117 changes to 'A'.

The contents A of the output data 116 from the flash memory data register 109 and the contents A' of the output data 117 from the ECC data register 113 are compared to each other by the bit comparing circuit 115. Then an output result signal 124 is outputted, where the only mismatched bits between the 'A' and 'A'' (the error bit of data A) are set to datum '1', while other bits are set to datum '0'. At the same time, the error detection signal 123 of the bit comparing circuit 115 changes to level 'H' from level 'L'

A write-timing control signal 122 from the timing control circuit 118 changes to level 'H' from level 'L' at the timing t5, and according to that a write-enable signal 129a and a write-busy signal 126 changes to level 'H' from level 'L'. Receiving the change of level 'H' of the write-busy signal 126, the timing control circuit 118 recognizes the starting of the write-cycle, and then changes the level of the address-latch signal 121 and the latch signal 119 to the flash memory data register 109, and the data latch signal 120 is inputted to the ECC data register 113 to level 'L' from level 'H'. These signals are fixed to level 'L' and the write-timing signal 122 is fixed to level 'H' during the write-cycle.

While, the write-enable signal 129 in the address memory 127a is set to level 'H' during the write-cycle and a write-enable signal (WE) is set to level 'H', the contents of the address register 114 are written in the address memory 201. At the same time, datum '1' is written in the memory chip 205.

Since the write-enable signal 129a is set to level 'H' during the write-cycle in the error data memory 128a, too, datum '1' is written in the memory chip 401 while the write-enable signal (WE) is set to level 'H' in the error-bit memory circuit 401 corresponding to the error bit in the output data 124 of the bit-comparing circuit 115, where, the number of the error-bit memory circuits equipped in each error data memory is equal to the number corresponding to the data bit-width and the checkbit bit-width (in case of FIG. 1. the number is 38 corresponding to 32 bit-width of the data and 6 bit-width of the checkbit).

When writing into the address memory 127a and the error data memory 128a is completed, the timing controller 118 changes the level of the write-timing control signal 122 to level 'L' from level 'H', accordingly the write-busy signal 126 changes to level 'L' from level 'H' and the write cycle is finished. Even when the write-cycle occurs during the read-cycle, there is no influence in taking the necessary correction data 110 by the CPU 100 because the contents of the flash memory data register 109, the ECC data register 113, or the address register 114 is not renewed.

Since there is no one-bit error in the data B of the output memory data 103 and 104 at the address 2a of the flash memory in the read-cycle (2), the data, which are respectively saved in the flash memory data register 109 and the ECC data register 113 by the same action as in the read-cycle (1), come to be B. For this reason, when the write timing signal is set to level 'H' there is no write action because the error detecting signal 123 holds level 'L', the write-busy signal holds level 'L' as well.

At the read cycle (3), when the flash-memory memory data 103 and 104 of address 1 (data A), which include one-bit error at address 1a, output again, the contents of the address output 102 are compared with the contents of the memory chip 201 in an address comparing circuit 202 of the address memory 127a, and then the address matching signal 131 changes to level 'H' from level 'L' since both addresses match each other in this case. The address matching signal 131 is set to level 'H', and consequently the output of the error-bit memory circuit in the error data memory 128a, in which datum '1' is already written, changes to level 'H' from level 'L'. Since the outputs from other error-bit memory circuits are still level 'L', only one bit corresponding to the abovementioned one-bit error changes to level 'H' among all bit having level 'L' in the reverse-bit selection signal 135, which is the output from the data OR circuit 134 conducting OR logic operation of the output signals 133a-133x from the error data memories 128a-128x.

The selected-bit reverse circuit 105 reverses only bits of the output memory data 103 and 104 of the flash memory and outputs data A to the output data 106 and 107 of the selected-bit reverse circuit 105 after receiving the reverse-bit selection signal 135. After that, both data groups held by the flash memory data register 109 and the ECC data register 113 become data 'A' by the same action as the aforementioned cycle (1). Consequently, no write-operation occurs by the same action as the read-cycle (2).

When the output memory data 103 and 104 at other address includes one-bit error in the later write-cycle, the write enable signal 129b changes to level 'H' from level 'L' by the same action as in the write-cycle (1) on this occasion, and the corresponding address is written in the address memory 127b during the write cycle, and the error-bit location revealed in the bit-comparing result signal 124 from the bit-comparing circuit 115 is written in the error-bit memory circuit corresponding to the error-bit memory 128b. Where, the address memories and the error-bit data memories can be equipped in necessary numbers according to the required reliability.

Even when an additional bit becomes error memory data 103 and 104 at the address 1a of the flash-memory and two-bit error occurs, the contents of the output data 106 and 107 of the selected-bit reverse circuit 105 become one-bit error as in the case of the write-cycle (1). Since the one bit detected to be error in the cycle (1) is reversed to be the right value by the selected-bit reverse circuit 105, the new one-bit error is only outputted. Consequently the correction data 110 corrected by the ECC circuit 108 are given to the CPU 100. After that action, the error detection signal 123 changes to level 'H' from level 'L' according to the data discrepancy in the bit-comparing circuit 115 as in the read-cycle(1), and then write action arises. Since the address has been already written in the address memory 127a, however, the write enable signal (WE) corresponding to the one-bit error in the output data 124 of the bit-comparing circuit 115 changes to level 'H' and the datum '1' is written in the memory chip 401.

Through all these actions in the error correction circuit according to this invention, the rightly correction data 110 can be supplied to the CPU 100, even if all bits of the flash memory output become errors.

As explained before, more-than-two-bit errors, which cannot be corrected by a conventional ECC circuit using only six-bit checkbit to the 32-bit-width data, can be corrected according to the first embodiment of this invention. Therefore, the ICs having the built-in flash memory in which the operation program is installed have no malfunctions even if a two-bit error occurs at the same address, and then improvement in the reliability of the ICs is able to be realized. In addition, since the number of the address memories that store the addresses of the error data and the number of the error data memories both can be changed without limitation and only with a small modification in the write control circuit 125, the most appropriate circuit capacity is able to be chosen according to the reliability of the flash memory.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

Second Embodiment

A second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

Figure 6:
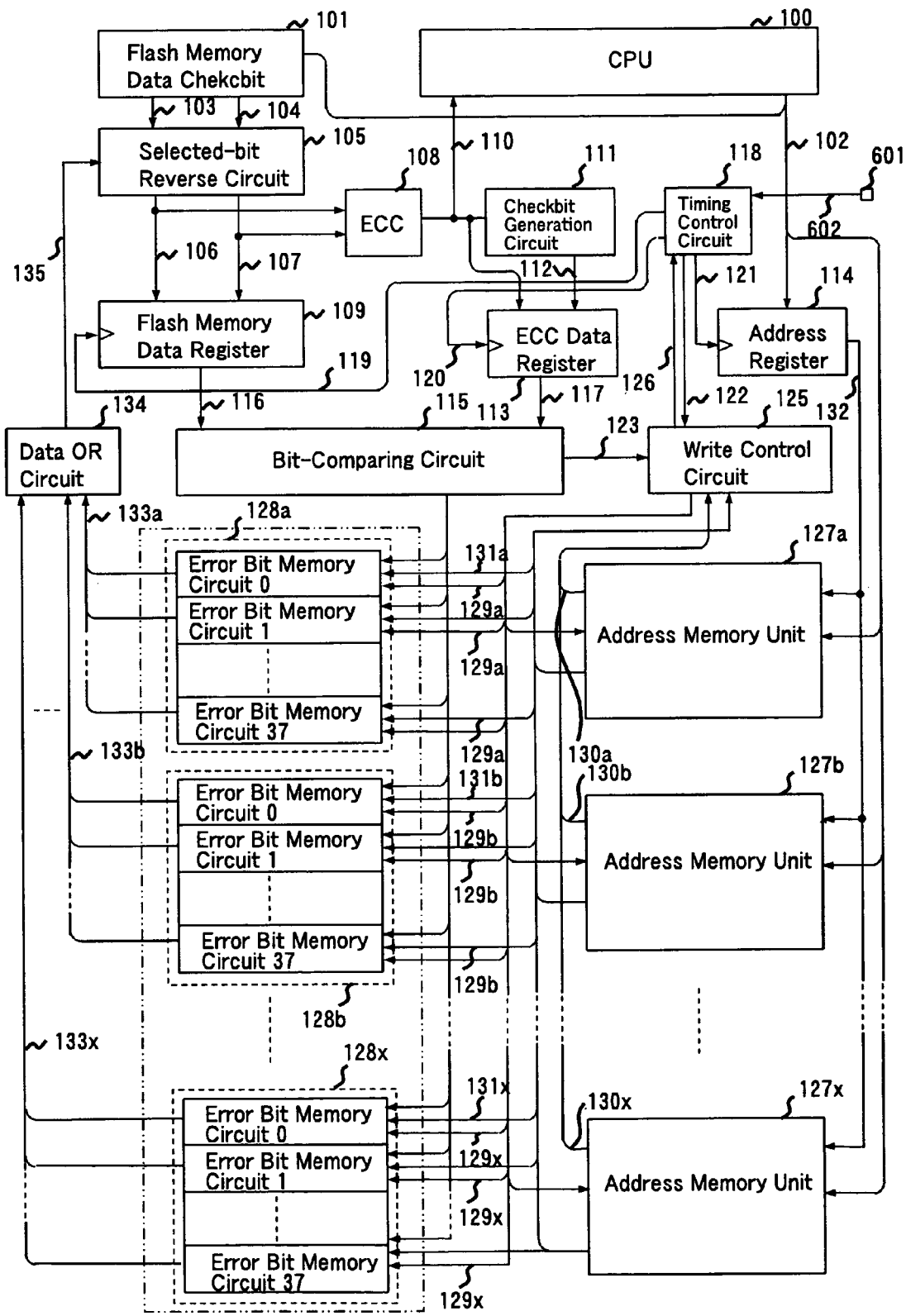
FIG. 6 is a view of a block diagram illustrating a basic configuration of an ECC circuit in accordance with a second embodiment of the present invention.

FIG. 6 is a block diagram illustrating the configuration of an error correction circuit according to a second embodiment of the present invention. The main difference between the first embodiment of the present invention and this one is that an external input terminal 601 is equipped and an input signal 602 that is inputted from this input terminal 601 is inputted to the timing control circuit 118. Referring to FIG. 6, the error correction circuit of the second embodiment will now be explained as below.

When the input signal 602 from the external input terminal 601 is level 'L', the address latch signal 121, the flash-memory-data latch signal 119, the latch signal 120 for the ECC data register 113, and the write-timing control signal 122 are controlled to be fixed to level 'L' (invalid level) in the timing control circuit 118. These signal levels cause the address register 114, the flash-memory-data register 109, and the ECC data register 113 to stop respectively holding data. At the same time, since the write-timing control signal 122 is fixed to level 'L' and then all output data from the write control circuit 125 are fixed to level 'L', the write operation is stopped.

While, in the case when the input signal 602 from the external input terminal 601 is level 'H', the address latch signal 121, the flash-memory-data latch signal 119, the latch signal 120 of the ECC data register 113, and the write-timing control signal 122 are controlled in the timing control circuit 118, as illustrated in FIG. 5. These signals cause the address register 114, flash-memory-data register 109, and the ECC data register 113 to hold respectively data at the rising edges of their latch signals, and then the write operation is available after the write control circuit 125 becomes active according to the change to level 'H' of the write-timing control signal 122.

As described before, according to the error correction circuit of the second embodiment of this invention, it becomes possible that the function according to the first embodiment of this invention is not available, based on the input signal 602 from the external terminal 601. Consequently, the error correction circuit becomes able to prevent from writing unnecessary data in the address memory or the error data memory in case of its shipment test or in case pseudo data are stored in the flash memory for a test operation.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2004-053317. The entire disclosure of Japanese Patent Application No. 2004-053317 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. An error correction circuit comprising:
    a selected-bit reverse circuit being configured to reverse error bits in output data based on a first signal, said output data including memory data and a check data from a memory device;
    an ECC circuit being configured to correct a one-bit error based on said output data;
    a checkbit generation circuit being configured to generate checkbits based on correction data outputted from said ECC circuit;
    an ECC data register being configured to store said correction data and said check data;
    a bit-comparing circuit being configured to compare each bit between a first data group of said output data from said selected-bit reverse circuit and a second data group of output data from said ECC data register;
    an address memory unit being configured to store an address corresponding to said memory data when said bit-comparing circuit detects a discrepancy between said first data group and said second data group;
    an error data memory unit being configured to include a plurality of memory circuits having a necessary number for a predetermined data-width, said error data memory unit being configured to write discrepancy information at a bit-location corresponding to said discrepancy when said bit-comparing circuit detects said discrepancy between said first data group and said second data group;
    a data OR circuit being configured to perform a logical operation between each data group stored in said plurality of memory circuits of said error-data memory unit and to generate said first signal.

2. The error correction circuit according to claim 1, wherein an additional external terminal is configured to disable error correction based on a signal inputted from said external terminal.

3. The error correction circuit according to claim 1, wherein said address memory unit includes an address comparing circuit configured to enable output data from each of said plurality of memory circuits of said error data memory unit corresponding to said address corresponding to said memory data when a referred address matches a stored address in said memory.

4. The error correction circuit according to claim 1, further comprising a CPU configured to output address data.

5. The error correction circuit according to claim 4, further comprising a flash memory configured to output said output data upon receiving said address data from said CPU.

6. The error correction circuit according to claim 5, further comprising a flash memory data register configured to receive data from said selected-bit reverse circuit.

7. The error correction circuit according to claim 6, further comprising an address register configured to store said output address data from said CPU.

8. The error correction circuit according to claim 7, further comprising a timing control circuit configured to control data setting timing in each component.

9. The error correction circuit according to claim 8, further comprising a write control circuit being configured to control writing data in said address memory unit and said error data memory unit.

10. The error correction circuit according to claim 2, further comprising a CPU configured to output address data.

11. The error correction circuit according to claim 10, further comprising a flash memory configured to output said output data upon receiving said address data from said CPU.

12. The error correction circuit according to claim 11, further comprising a flash memory data register configured to receive data from said selected-bit reverse circuit.

13. The error correction circuit according to claim 12, further comprising an address register configured to store said output address data from said CPU.

14. The error correction circuit according to claim 13, further comprising a timing control circuit configured to control data setting timing in each component.

15. The error correction circuit according to claim 14, further comprising a write control circuit being configured to control writing data in said address memory unit and said error data memory unit.

16. The error correction circuit according to claim 3, further comprising a CPU configured to output address data.

17. The error correction circuit according to claim 16, further comprising a flash memory configured to output said output data upon receiving said address data from said CPU.

18. The error correction circuit according to claim 17, further comprising a flash memory data register configured to receive data from said selected-bit reverse circuit.

19. The error correction circuit according to claim 18, further comprising an address register configured to store said output address data from said CPU.

20. The error correction circuit according to claim 19, further comprising a timing control circuit configured to control data setting timing in each component.

* * * * *